(12) United States Patent
Wang et al.

(10) Patent No.: US 7,006,888 B2
(45) Date of Patent: Feb. 28, 2006

(54) SEMICONDUCTOR WAFER PREHEATING

(75) Inventors: Hougong Wang, Pleasanton, CA (US);
Kenny King-Tai Ngan, Fremont, CA (US); Zheng Xu, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 400 days.

(21) Appl. No.: 10/046,954

(22) Filed: Jan. 14, 2002

(65) Prior Publication Data

US 2003/0133773 A1    Jul. 17, 2003

(51) Int. Cl.
*G06F 19/00*    (2006.01)

(52) U.S. Cl. .................. 700/121; 700/96; 29/25.01; 414/217

(58) Field of Classification Search ........... 700/121, 700/98, 96; 118/719, 715; 414/217, 939; 29/25.01, 25.02; 204/192.17; 137/565.3
See application file for complete search history.

(56) References Cited

U.S. PATENT DOCUMENTS

| | | | |
|---|---|---|---|
| 4,512,391 A | 4/1985 | Harra | 165/48 R |
| 5,186,718 A * | 2/1993 | Tepman et al. | 29/25.01 |
| 5,286,296 A | 2/1994 | Sato et al. | 118/719 |
| 5,292,393 A | 3/1994 | Maydan et al. | 156/345 |
| 5,607,009 A | 3/1997 | Turner et al. | 165/48.1 |
| 5,609,689 A | 3/1997 | Kato et al. | 118/719 |
| 5,838,121 A | 11/1998 | Fairbairn | 318/45 |
| 5,844,195 A | 12/1998 | Fairbairn et al. | 219/121.43 |
| 5,855,681 A | 1/1999 | Maydan et al. | 118/719 |
| 5,902,088 A | 5/1999 | Fairbairn et al. | 414/217 |

(Continued)

FOREIGN PATENT DOCUMENTS

JP    7-094489    4/1994

(Continued)

OTHER PUBLICATIONS

U.S. Appl. No. 09/505,901, filed Feb. 17, 2000, Fairbairn, et al., Entitled: "Load-lock with External Staging Area".

*Primary Examiner*—Kidest Bahta
(74) *Attorney, Agent, or Firm*—Patterson & Sheridan

(57) ABSTRACT

Embodiments of the present invention provide a method, article of manufacture, and apparatus for processing semiconductor wafers. The method includes preheating a semiconductor wafer in two types of chambers. In one embodiment, a first preheating chamber is a load lock and a second preheating chamber is a transition chamber. Semiconductor wafer processing systems which can perform embodiments of the method are presented.

4 Claims, 5 Drawing Sheets

U.S. PATENT DOCUMENTS

| | | | |
|---|---|---|---|
| 5,905,302 A | 5/1999 | Lane et al. | 257/678 |
| 5,909,994 A | 6/1999 | Blum et al. | 414/217 |
| 5,911,834 A | 6/1999 | Fairbairn et al. | 134/1.3 |
| 6,000,227 A | 12/1999 | Kroeker | 62/62 |
| 6,143,083 A | 11/2000 | Yonemitsu et al. | 118/719 |
| 6,235,634 B1 | 5/2001 | White et al. | 438/680 |
| 6,251,759 B1 | 6/2001 | Guo et al. | 438/584 |
| 6,270,582 B1 | 8/2001 | Rivkin et al. | 118/719 |
| 6,286,230 B1 * | 9/2001 | White et al. | 34/403 |
| 6,375,746 B1 * | 4/2002 | Stevens et al. | 118/719 |
| 6,719,517 B1 * | 4/2004 | Beaulieu et al. | 414/217 |
| 2002/0103836 A1 * | 8/2002 | Fein et al. | 707/531 |
| 2003/0190220 A1 * | 10/2003 | White et al. | 414/217 |
| 2005/0034767 A1 * | 2/2005 | Reimer et al. | 137/565.23 |

FOREIGN PATENT DOCUMENTS

| | | |
|---|---|---|
| JP | 6-132379 | 5/1994 |
| JP | 6-314730 | 11/1994 |
| JP | 7-086169 | 3/1995 |
| JP | 7-142552 | 6/1995 |
| JP | 7-335711 | 12/1995 |
| JP | 9-246347 | 9/1997 |
| JP | 10-275848 | 11/1998 |

* cited by examiner

SEMICONDUCTOR WAFER PREHEATING

BACKGROUND OF INVENTION

1. Field of Invention

The present invention generally relates to a method, article of manufacture, and apparatus for processing wafers in a semiconductor wafer processing system. More particularly, the present invention provides a processing sequence in which wafers are at least partially preheated in transition chambers in a semiconductor wafer processing system.

2. Description of the Related Art

Semiconductor wafer processing systems comprising an integrated unit which contains multiple processing chambers are well known in the art. The integrated unit reduces contamination in the system components and increases the throughput of the system. An example of a semiconductor wafer processing sytem with such a unit is the Endura® platform available from Applied Materials, Inc. of Santa Clara, Calif. The Endura® platform has a pre-metallization cluster with chambers in which wafers are entered, oriented, degassed, sputter cleaned, and cooled and at least one metallization cluster of processing chambers wherein metal deposition is performed. The pre-metallization and metallization clusters are connected by transition or pass-through chambers.

Typically, the only components of an integrated unit of a semiconductor wafer processing system that are vented to the atmosphere during processing are wafer load locks through which wafers enter and exit from the system. Single or batch wafer load locks can be used. Single wafer load locks are small and deliver one or two wafers to the system, while batch wafer load locks are larger and deliver more wafers. Single wafer load locks are often preferred because their smaller volumes do not require as much time to transition to the desired vacuum pressure from atmospheric pressure as batch wafer load locks.

Wafer load locks which can perform required pre-processing and post-processing steps on wafers have been developed. For example, a single wafer load lock can include a heating element to preheat a wafer before further processing. Preheating may also be used to degas a wafer, i.e., remove contaminants from the wafer surface. Other pre-processing cleaning may also be performed in the load lock. A single wafer load lock can also function as a cool-down chamber to cool a wafer that has been treated in a processing chamber. Including pre- and post-processing functions in single wafer load locks eliminates the need for separate pre- and post-processing chambers and reduces the time required to transfer a wafer into and out of such chambers.

An important aspect in the processing of wafers in a semiconductor wafer processing system is the number of wafers that pass through the system in a certain amount of time, which is called the throughput of the system. While wafer load locks with pre- and post-processing functions have improved the throughput of semiconductor wafer processing systems such as the Endura® platform, greater increases in throughput are desired. In some cases, the slowest step in the integrated unit of a semiconductor wafer processing system is the pre-processing step in the single wafer load lock. Thus, a method and apparatus for faster pre-processing is needed.

SUMMARY OF THE INVENTION

The present invention provides a method, article of manufacture, and apparatus for processing a wafer in a semiconductor wafer processing system. The method for processing a wafer includes partially preheating a wafer in a load lock and partially pre-heating a wafer in a transition chamber. More particularly, the method for processing a wafer comprises introducing a wafer into a first load lock, partially preheating the wafer in the load lock, transferring the wafer into a transition chamber, and partially preheating the wafer in the transition chamber. The method may further comprise transferring the wafer into a processing chamber, performing a processing step on the wafer in the processing chamber, and transferring the wafer into a second load lock, wherein the first load lock is either the same or a different load lock than the first load lock. The wafer may be transferred into and processed in multiple processing chambers before the wafer is transferred into the second load lock. The wafer may also be transferred into a second transition chamber after it is processed and before it is transferred into the second load lock. In one or more embodiments the wafer may be processed in one or more processing chambers and then transferred into the second load lock via the second transition chamber. Further, the wafer may be transferred between the one or more processing chambers via the second transition chamber.

In one or more embodiments, the wafer is partially preheated in a load lock by a lamp and then partially preheated in a transition chamber by a lamp. In another one or more embodiments, the wafer is wafer is partially preheated in a load lock by a lamp and then partially preheated in a transition chamber by a resistive heater.

In one or more embodiments, the wafer is preheated in a processing system in which the transition chambers are isolated from the rest of the processing system. In another one or more embodiments, the wafer is preheated in a processing system in which the transition chambers are un-isolated, i.e., not isolated from the rest of the processing system.

In one or more embodiments, processing the wafer includes cooling the wafer in a transition chamber and/or a load lock. For example, the wafer may be cooled in a transition chamber and/or a load lock after the wafer has been treated with one or more processing steps.

In another aspect, a semiconductor wafer processing system comprises a first and second chamber, the first and second chambers each having one or more processing chambers attached thereto, a load lock comprising a heating element and attached to the first chamber, and two or more transition chambers which separate the first and second chambers, the transition chambers each comprising a heating element disposed therein. The transition chamber heating element may comprise a lamp or a resistive heater.

In another embodiment, the semiconductor wafer processing system comprises a chamber having one or more processing chambers attached thereto, a load lock comprising a heating element, the load lock being attached to the chamber, and two or more transition chambers within the chamber, each transition chamber comprising a heating element disposed therein. The transition chamber heating element may comprise a lamp.

BRIEF DESCRIPTION OF THE DRAWINGS

So that the manner in which the features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
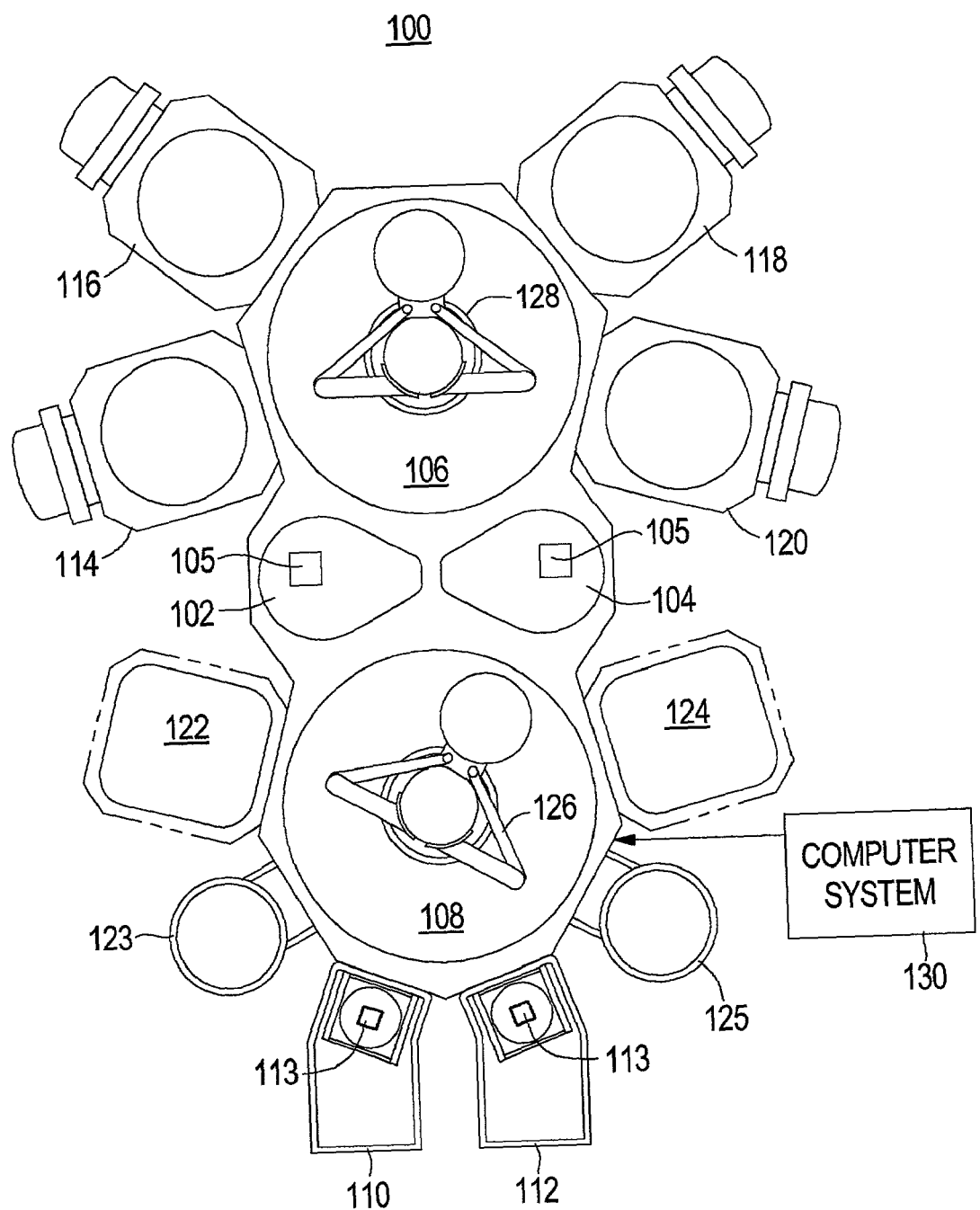
FIG. 1 is a top schematic view of a multiple chamber semiconductor wafer processing system.

An example of a multiple chamber semiconductor wafer processing system for performing embodiments of the processes described herein is the Endura® CL System manufactured by Applied Materials, Inc. of Santa Clara, Calif. FIG. 1 depicts a semiconductor wafer processing system 100 that is similar to an Endura® CL System, but has modified transition chambers 102 and 104 that contain heating elements 105. The system 100 also comprises a transfer chamber 106, a buffer chamber 108, single wafer load locks 110 and 112, processing chambers 114, 116, 118, 120, 122, and 124, preheating chambers 123 and 125, and robots 126 and 128. The single wafer load locks 110 and 112 contain heating elements 113 and are attached to the buffer chamber 108. Processing chambers 114, 116, 118, and 120 are attached to transfer chamber 106. Processing chambers 122 and 124 are attached to buffer chamber 108. The operation of the system 100 is controlled by a computer system 130. The computer system 130 may be any device or combination of devices configured to implement the inventive operations provided herein. As such, the computer system 130 may be a controller or array of controllers and/or a general purpose computer configured with software which, when executed, performs the inventive operations.

Figure 2:
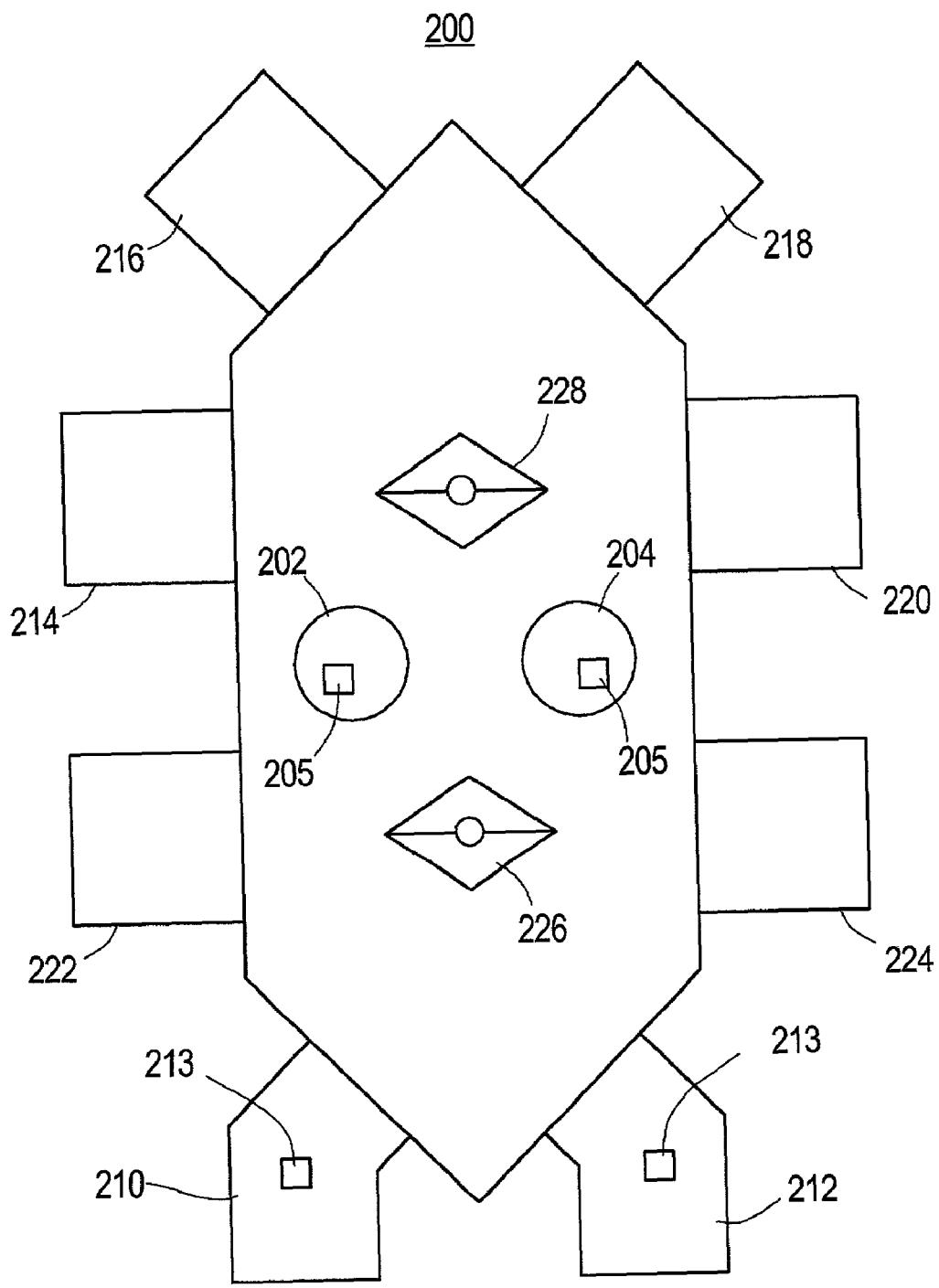
FIG. 2 is a top schematic view of another multiple chamber semiconductor wafer processing system.

FIG. 2 depicts another example of a multiple chamber semiconductor wafer processing system 200 for performing embodiments of the processes described herein. FIG. 2 shows a version of the Endura® SL System manufactured by Applied Materials, Inc. of Santa Clara, Calif. with modified transition chambers 202 and 204 that contain heating elements 205. The tool 200 also comprises a transfer chamber 206, single wafer load locks 210 and 212, processing chambers 214, 216, 218, 220, 222, and 224, and robots 226 and 228. The single wafer load locks 210 and 212 contain heating elements 213 and are attached to the transfer chamber 206. Processing chambers 214, 216, 218, 220, 222, and 224 are attached to transfer chamber 206. The operation of the system 200 is controlled by a computer system 130 similar or identical to the computer system shown for the system 100.

In the embodiments of semiconductor wafer processing systems and wafer processing sequences described herein, the load locks shown and used are single wafer load locks. However, other types of load locks may be used in any or all of the embodiments described herein.

Figure 3:
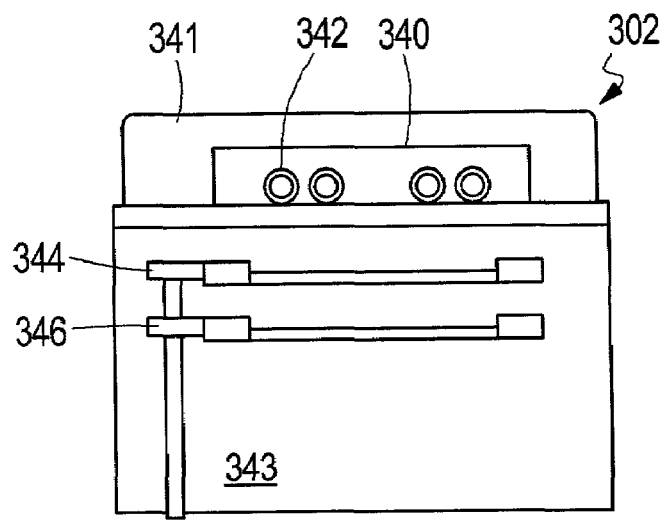
FIG. 3 is a cross-sectional, schematic view of a chamber including a lamp.

In one or more embodiments, the transition chambers 102, 104, 202, 204 and/or the single wafer load locks 110, 112, 210, 212 include a heating element, such as a lamp which performs a lamp preheat. FIG. 3 shows a cross-section of an example of a chamber 302 including a lamp 340. The chamber 302 may be representative of a transition chamber and/or a single wafer load lock. Illustratively, the chamber 302 also includes a first wafer holder 344 and a second wafer holder 346, positionable below the lamp 340. The lamp 340 is disposed in lamp module 341 containing the lamp wiring for providing electricity (not shown) and may be separated from the body 343 of the chamber 302, e.g., by a quartz window (not shown). The lamp 340 has bulbs 342 which emit heat that can degas a wafer (not shown) in the first wafer holder 344. While one wafer is being preheated in the first wafer holder 344, another wafer (not shown) may be positioned on or removed from the second wafer holder 346 of the chamber 302.

Figure 4:
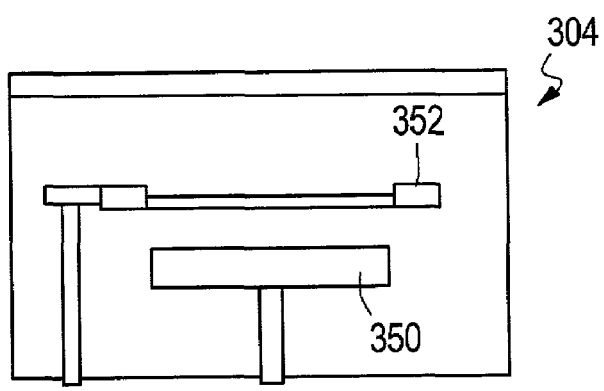
FIG. 4 is a cross-sectional, schematic view of a chamber including a resistive heater.

In another embodiment, the transition chambers 102, 104, 202, 204 and/or the single wafer load locks 110, 112, 210, 212 include a resistive heater which performs the preheating. FIG. 4 shows a cross-section of an example of a chamber 304 including a resistive heater 350, which is in the form of a heated pedestal. The chamber 304 may be representative of a transition chamber and/or a single wafer load lock. The chamber 304 also includes a wafer holder 352. A wafer (not shown) may be degassed by the heated resistive heater 350 in the presence of a few Torr of back filled inert gas, such as argon gas.

Figure 5:
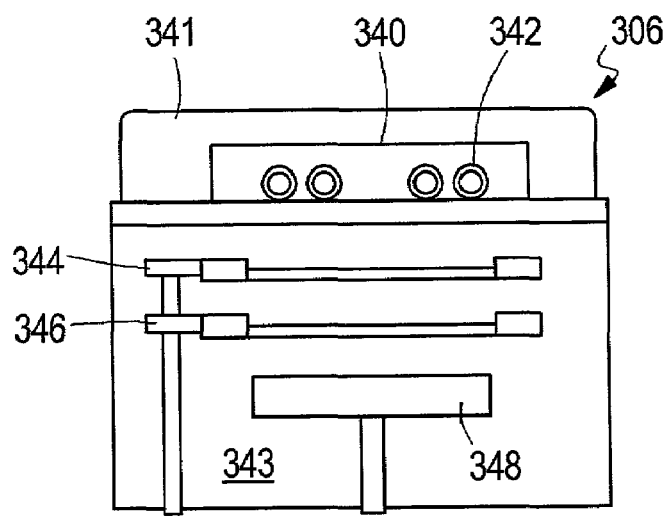
FIG. 5 is a cross-sectional, schematic view of a chamber including a lamp and a cooling plate.

In another embodiment, the transition chambers 102, 104, 202, 204 and/or the single wafer load locks 110, 112, 210, 212 include a lamp and a cooling plate. FIG. 5 shows a cross-section of an example of a chamber 306 including both a lamp 340 and a cooling plate 348, and two wafer holders, 344 and 346. The chamber 306 may be representative of a transition chamber and/or a single wafer load lock. The lamp 340 is located in a position similar to that shown in FIG. 3, and the cooling plate 348 is located in a position similar to the position of the resistive heater 350 shown in FIG. 4. The lamp 340 is disposed in lamp module 341 containing the lamp wiring for providing electricity (not shown) and is separated from the body 343 of the chamber 306, e.g., by a quartz window (not shown). The lamp 340 has bulbs 342 which emit heat that can degas a wafer (not shown) in the wafer holder. The bottom wafer holder 346, i.e., the wafer holder closest to the cooling plate 348, can be used to hold a wafer that is being cooled by the cooling plate 348. The top wafer holder 344, i.e., the wafer holder closest to the lamp 340, can be used to hold a wafer that is being degassed by the lamp 340.

Figure 6:
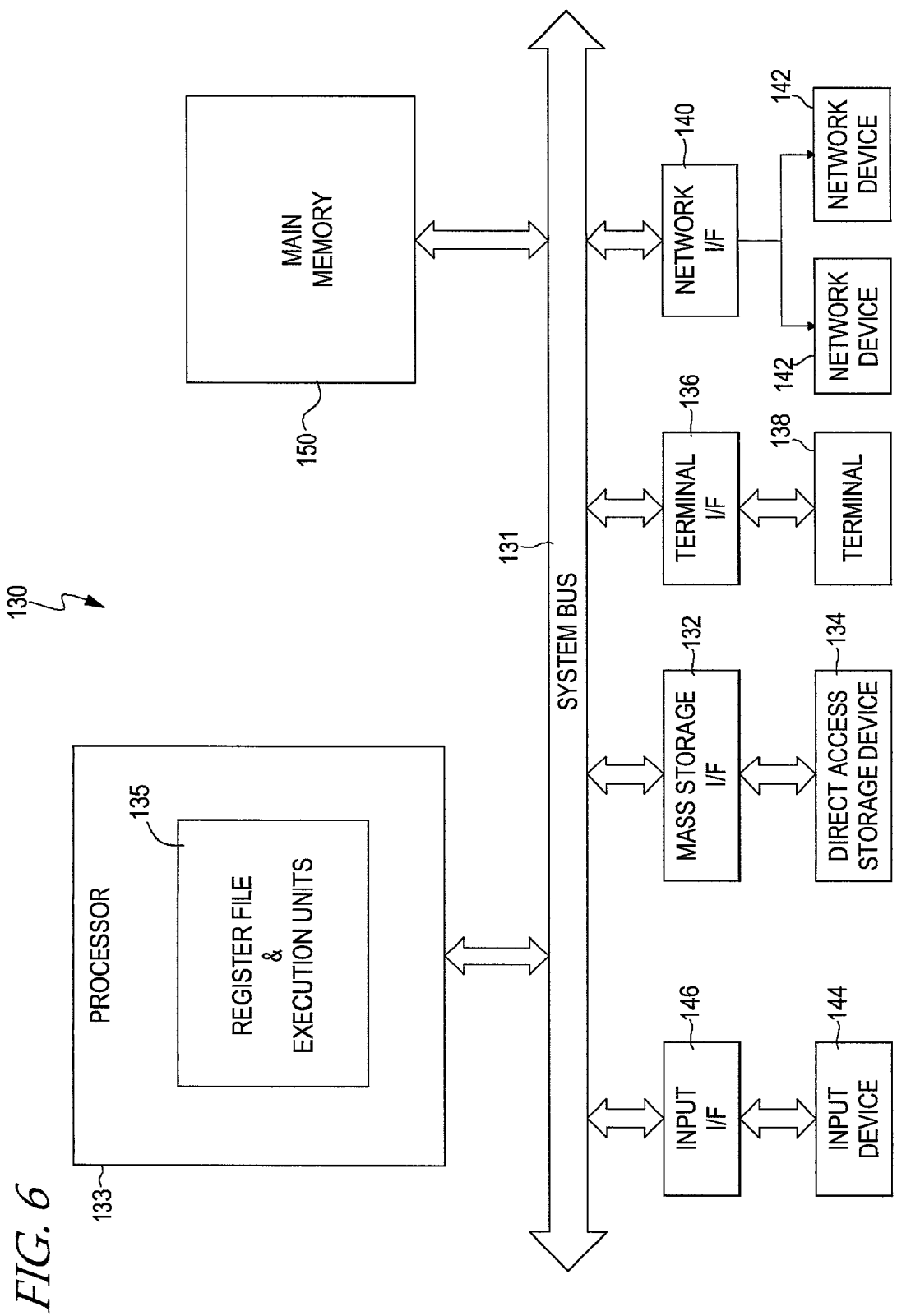
FIG. 6 is a computer system according to an embodiment.

FIG. 6 shows one embodiment of the computer system 130. Illustratively, the computer system 130 includes a system bus 131, at least one processor 133 coupled to the system bus 131. The computer system 130 also includes an input device 144 coupled to system bus 131 via an input interface 146, a storage device 134 coupled to system bus 131 via a mass storage interface 132, a terminal 138 coupled to system bus 131 via a terminal interface 136, and a plurality of networked devices 142 coupled to system bus 131 via a network interface 140.

Terminal 138 is any display device such as a cathode ray tube (CRT) or a plasma screen. Terminal 138 and networked devices 142 may be desktop or PC-based computers, workstations, network terminals, or other networked computer systems. Input device 144 can be any device to give input to the computer system 130. For example, a keyboard, keypad, light pen, touch screen, button, mouse, track ball, or speech recognition unit could be used. Further, although shown separately from the input device, the terminal 138 and input device 144 could be combined. For example, a display screen with an integrated touch screen, a display with an integrated keyboard or a speech recognition unit combined with a text speech converter could be used.

Storage device 134 is DASD (Direct Access Storage Device), although it could be any other storage such as floppy disc drives or optical storage. Although storage 134 is shown as a single unit, it could be any combination of fixed and/or removable storage devices, such as fixed disc drives, floppy disc drives, tape drives, removable memory cards, or optical storage. Main memory 150 and storage device 134 could be part of one virtual address space spanning multiple primary and secondary storage devices.

The contents of main memory 150 can be loaded from and stored to the storage device 134 as processor 133 has a need for it. Main memory 150 is any memory device sufficiently large to hold the necessary programming and data structures of the invention. The main memory 150 could be one or a combination of memory devices, including random access memory (RAM), non-volatile or backup memory such as programmable or flash memory or read-only memory (ROM). The main memory 150 may be physically located in another part of the computer system 130. While main memory 150 is shown as a single entity, it should be understood that memory 150 may in fact comprise a plurality of modules, and that main memory 150 may exist at multiple levels, from high speed registers and caches to lower speed but larger DRAM chips.

In general, the routines executed to implement the embodiments of the invention may be implemented as part of an operating system or a specific application, component, program, object, module or sequence of instructions and may be generally referred to as a "program". The inventive program typically comprises one or more instructions that are resident at various times in various memory and storage devices in a computer, and that, when read and executed by one or more processors in a computer, cause that computer to perform the steps necessary to execute steps or elements embodying the various aspects of the invention.

In addition, various programs and devices described hereinafter may be identified based upon the application for which they are implemented in a specific embodiment of the invention. However, it should be appreciated that any particular program or device nomenclature that follows is used merely for convenience, and the invention is not limited to use solely in any specific application identified and/or implied by such nomenclature.

Moreover, while some embodiments have and hereinafter will be described in the context of fully functioning computers and computer systems, those skilled in the art will appreciate that the various embodiments of the invention are capable of being distributed as a program product in a variety of forms, and that embodiments of the invention apply equally regardless of the particular type of signal bearing media used to actually carry out the distribution. Examples of signal bearing media (also referred to herein as computer readable medium) include, but are not limited to, recordable type media such as volatile and nonvolatile memory devices, floppy and other removable disks, hard disk drives, optical disks (e.g., CD-ROMs, DVDs, etc.), controllers and transmission type media such as digital and analog communication links. Transmission type media include information conveyed to a computer by a communications medium, such as through a computer or telephone network, and includes wireless communications. The latter embodiment specifically includes information downloaded from the Internet and other networks. Such signal-bearing media, when carrying computer-readable instructions that direct the functions of the present invention, represent embodiments of the present invention.

Figure 7:
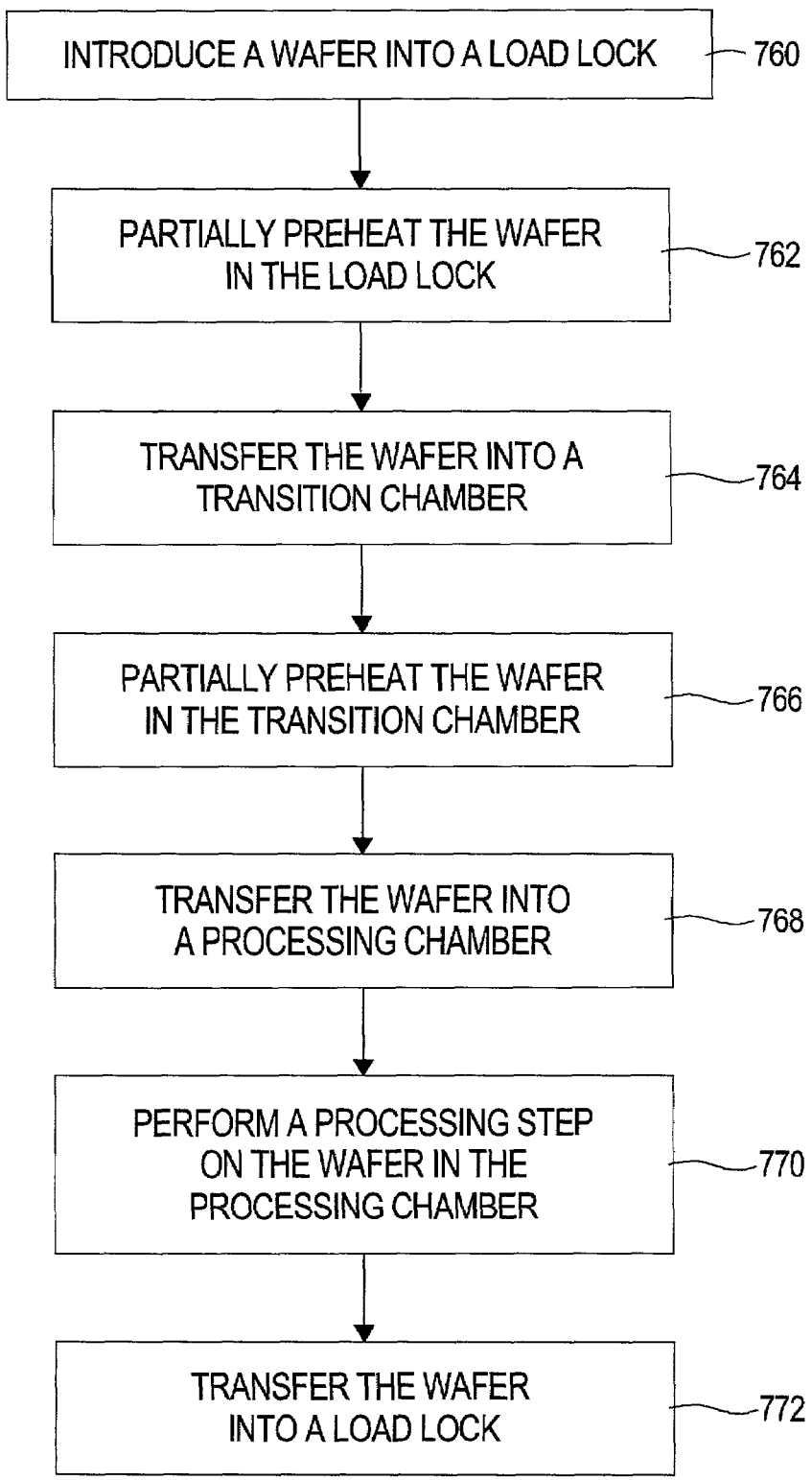
FIG. 7 is an illustrative flow chart of processes performed by a computer system in an embodiment.

FIG. 7 is an illustrative flow chart of processes performed by the computer system 130 in an embodiment. A wafer is introduced into a load lock in step 760. The wafer is partially preheated in the load lock in step 762. The wafer is transferred into a transition chamber in step 764. The wafer is partially preheated in the transition chamber in step 766. The wafer is transferred into a processing chamber in step 768. A processing step is performed on the wafer in the processing chamber in step 770. The wafer is transferred into a load lock in step 772. In another embodiment, the computer system 130 performs the processes described in steps 760, 762, 764, and 766. These processes and other processes that may be performed by the computer system 130 are described in more detail below.

Generally, the wafer processing sequences described herein include the steps of partially pre-processing a wafer in a load lock of a semiconductor processing system and partially pre-processing the wafer in a transition chamber of a semiconductor wafer processing system. By moving part of the pre-processing procedure to the transition chambers from the load locks or separate pre-processing chambers, the throughput of a semiconductor wafer processing system can be increased. For example, if complete pre-processing of a wafer takes two minutes in a load lock, while the maximum time for any other step in the wafer processing system is less than two minutes, pre-processing is the throughput-limiting step. According to one particular embodiment, however, the wafer is pre-processed for about one minute in a load lock and for about one minute in a transition chamber. The throughput of the system will be approximately doubled since wafers will be passed through the load lock at approximately twice the rate at which they are passed through when they spend two minutes in the load lock.

In one or more embodiments, a wafer is introduced into a single wafer load lock 110 or 112 of system 100. The single wafer load locks 110 and 112 may include a heating element 113, such as a lamp or a resistive heater, and they may also include other cleaning systems or a cooling plate (not shown). The load lock 110 or 112 is closed and a vacuum is created within the load lock 110 or 112. The wafer is then partially preheated such as by heating the load lock 110 or 112 with a lamp. The partially preheated wafer is transferred by a robot 126 to transition chamber 102 or 104. The rest of the preheating procedure is performed in the transition chamber 102 or 104. Thus, if it is desired to degas a wafer, it may be partially degassed in a single wafer load lock and partially degassed in a transition chamber. The transition chambers 102 and 104 are modified transition chambers which have heating elements 105 for preheating.

In one aspect, preheating in a single wafer load lock and a transition chamber by using a lamp is preferred because, unlike a preheating by a resistive heater, a preheating by a lamp can be performed in a vacuum. Thus, extra gas fill and pumping time is not required when using a lamp for preheating in the single wafer load lock or the transition chamber. In another aspect, if time and throughput are not a primary consideration, a preheating by a resistive heater in a transition chamber may provide a more predictable and consistent preheating than a preheating performed by a lamp because a preheating by a resistive heater is not subject to reflection from the wafer substrate, and thus, not subject to the loss of radiation and heat that can occur with a lamp preheating.

In one or more embodiments, after the preheating in the transition chamber 102 or 104, the wafer is transferred by a robot 128 to a processing chamber 114, 116, 118, or 120 that is attached to the transfer chamber 106. The wafer undergoes a processing step that is determined by the type of processing chamber the wafer is placed in. For example, processing chamber 114 can be a chemical vapor deposition chamber in which the wafer is treated with chemical vapor deposition. In one or more embodiments, the wafer is then transferred by the robot 128 from one of the processing chambers, e.g., 114, attached to the transfer chamber 106, to one or more of the processing chambers 116, 118, or 120 for further processing before the wafer is either transferred by the robot 128 to one of the transition chambers 102 or 104 or the wafer is transferred to one of the single wafer load locks 110, 112. In one or more other embodiments, the wafer is transferred either by the robot 128 from one of the processing chambers, e.g., 114, to one of the transition chambers 102 or 104, or the wafer is transferred to one of the single wafer load locks 110, 112.

In one or more other embodiments, after the preheating in the transition chamber 102 or 104, the wafer is transferred by a robot 126 to a processing chamber 122 or 124 that is attached to the buffer chamber 108. The wafer undergoes a processing step that is determined by the type of processing chamber the wafer is placed in. In one embodiment, the wafer is then transferred by the robot 126 from one of the processing chambers, e.g., 122, attached to the buffer chamber 108, to another processing chamber 124 for further processing before the wafer is transferred to one of the single wafer load locks 110, 112. In another embodiment, the wafer is transferred by the robot 126 from the processing chamber 122 to one of the single wafer load locks 110, 112. In one embodiment, the single wafer load lock includes a cooling plate. The wafer can be cooled in the single wafer load lock including a cooling plate. In one or more other embodiments, the wafer is transferred by a robot 126 from the transition chamber 102 or 104 to a single wafer load lock 110 or 112. As described above, the single wafer load lock 110 or 112 may include a cooling plate, and the wafer may be cooled on the cooling plate.

In one or more embodiments in which the wafer is passed through the transition chamber 102 or 104 after a processing step, the wafer is passed through the transition chamber 102 or 104 without being treated in any way in the transition chamber. In another embodiment, the wafer is cooled in a transition chamber 102 or 104 which has a cooling plate.

In one or more embodiments in which the wafer is passed through the transition chamber 102 or 104 after a processing step, the wafer is transferred by robot 126 from the transition chamber 102 or 104 to one or more of the processing chambers 122 or 124 attached to the buffer chamber 108, for further processing before it is transferred to a single wafer load lock 110 or 112.

In one or more embodiments using system 200 of FIG. 2, a wafer is introduced into a single wafer load lock 210 or 212 of system 200. The single wafer load locks 210 and 212 may include a heating element 213, such as a lamp, and they may also include a cooling plate (not shown). The load lock 210 or 212 is closed and a vacuum is created within the load lock 210 or 212. The wafer is then partially preheated by heating the load lock 210 or 212 with a lamp. The partially preheated wafer is transferred by a robot 226 to transition chamber 202 or 204. The rest of the preheating procedure is performed in the transition chamber 202 or 204. Thus, the wafer is partially preheated in a single wafer load lock and partially preheated in a transition chamber. The transition chambers 202 and 204 are modified transition chambers, which each include a heating element 205, such as a lamp which performs a lamp preheating. In one embodiment, the configuration of the lamps in transition chambers 202 and 204 is similar to the configuration of the lamp 340 shown in FIG. 3.

Unlike transition chambers 102 and 104 of FIG. 1, which are isolated from the transfer and buffer chambers 106 and 108, respectively, transition chambers 202 and 204 are not isolated from the transfer chamber 206. As defined herein, an "isolated" transition chamber is a transition chamber that can be controlled to have environmental conditions, such as temperature and pressure, which are different than the conditions in the transfer and/or buffer chambers which may be present in the integrated processing system in which the transition chamber is located. As defined herein, an "un-isolated" transition chamber is a transition chamber that cannot be controlled to have environmental conditions, such as temperature and pressure, which are different than the conditions in the transfer and/or buffer chambers which may be present in the integrated processing system in which the transition chamber is located. As the pressure required for a resistive heater preheating, typically about 3 or 4 Torr, is quite different from the typical transfer chamber pressure of about $10^{-7}$ to about $10^{-9}$ Torr, it may not be practical to use a resistive heater in transition chambers 202 and 204.

In one or more embodiments, after the preheating in the transition chamber 202 or 204, the wafer is transferred by a robot 228 to a processing chamber 214, 216, 218, or 220 that is attached to the transfer chamber 206. The wafer undergoes a processing step that is determined by the type of processing chamber the wafer is placed in. For example, processing chamber 214 can be a physical vapor deposition chamber in which the wafer is treated with physical vapor deposition. In one or more embodiments, the wafer is then transferred by the robot 228 from one of the processing chambers, e.g., 214, to one or more of the processing chambers 216, 218, or 220 for further processing before the wafer is either transferred by the robot 228 to one of the transition chambers 202 or 204 or the wafer is transferred to one of the single wafer load locks 210, 212. In one or more other embodiments, the wafer is either transferred by the robot 228 from one of the processing chambers, e.g., 214, to one of the transition chambers 202 or 204, or the wafer is transferred to one of the single wafer load locks 210, 212.

In one or more other embodiments, after the preheating in the transition chamber 202 or 204, the wafer is transferred by a robot 336 to a processing chamber 222 or 224 that is attached to a transfer chamber 206. The wafer undergoes a processing step that is determined by the type of processing chamber the wafer is placed in. In one or more embodiments, the wafer is then transferred by the robot 226 from one of the processing chambers, e.g., 22, attached to the transfer chamber 206, to another processing chamber 224 for further processing before the wafer is transferred to one of the single wafer load locks 210, 212. In another one or more embodiments, the wafer is transferred by the robot 226 from the processing chamber 222 to one of the single wafer load locks 210, 212.

In one or more embodiments in which the wafer is passed through the transition chamber 202 or 204 after a processing step, the wafer is transferred by a robot 226 from the transition chamber 202 or 204 to one or more of the processing chambers 222 or 224 before it is transferred to a single wafer load lock 210 or 212. In one or more embodiments, the single wafer load lock includes a cooling plate. The wafer can be cooled in the single wafer load lock including a cooling plate. In one or more other embodiments, the wafer is transferred by a robot 226 from the transition chamber 202 or 204 to a single wafer load lock 210 or 212. As described above, the single wafer load lock may include a cooling plate, and the wafer may be cooled on the cooling plate.

In each of the above described methods in which a wafer is transferred through a transition chamber twice, the wafer may be transferred either through the same transition chamber twice or through two different transition chambers. For example, a wafer that is processed in the system shown in FIG. 1 may be transferred once through chamber 102 and later through chamber 104. Alternatively, a wafer that is processed in the system shown in FIG. 1 may be transferred once through chamber 104 and later through chamber 102. Alternatively, a wafer that is processed in the system shown in FIG. 1 may be transferred once through chamber 102 and later through chamber 102 or transferred once through chamber 104 and later through chamber 104.

Similarly, in each of the above described methods in which a wafer is introduced into and transferred into a single wafer load lock, the wafer may be introduced and transferred into either the same single wafer load lock or a different single wafer load lock.

While the foregoing is directed to embodiments of the present invention, other and further embodiments of the invention may be devised without departing from the basic scope thereof, and the scope thereof is determined by the claims that follow.

What is claimed is:

1. A method of processing a wafer in a semiconductor wafer processing system, comprising:

introducing a wafer into a first load lock of a semiconductor wafer processing system, the semiconductor wafer processing system comprising:

a buffer chamber enclosing a first robot;

one or more processing chambers attached to the buffer chamber;

a transfer chamber enclosing a second robot;

one or more processing chambers attached to the transfer chamber, wherein at least one vapor deposition chamber is attached to the transfer chamber;

a first load lock comprising a heating element and attached to the buffer chamber; and two or more transition chambers which separate the transfer chamber and the buffer chamber, the transition chambers each comprising a heating element disposed therein;

partially preheating the wafer in the first load lock;

transferring the wafer into one of the transition chambers and partially preheating the wafer in the transition chamber;

transferring the wafer into one of the processing chambers attached to the transfer chamber; and then performing a vapor deposition on the wafer in the processing chamber.

2. The method of claim 1, wherein after partially preheating the wafer in the first load lock, the wafer is transferred by the first robot into the transition chamber; and after partially preheating the wafer in the transition chamber, the wafer is transferred from the transition chamber by the second robot into the processing chamber.

3. The method of claim 2, wherein after the vapor deposition is performed on the wafer, the wafer is transferred from the processing chamber by the second robot.

4. The method of claim 3, further comprising cooling the wafer in one of the transition chambers after performing a vapor deposition on the wafer.

* * * * *

UNITED STATES PATENT AND TRADEMARK OFFICE
CERTIFICATE OF CORRECTION

| | | |
|---|---|---|
| PATENT NO. | : 7,006,888 B2 | Page 1 of 1 |
| APPLICATION NO. | : 10/046954 | |
| DATED | : February 28, 2006 | |
| INVENTOR(S) | : Hougong Wang, Kenny King-Tai Ngan and Zheng Xu | |

It is certified that error appears in the above-identified patent and that said Letters Patent is hereby corrected as shown below:

In the Specification

Column 2, Line 31: Delete the second instance of "wafer is"

Column 8, Line 56: Change "22" to --222--

Signed and Sealed this

Twelfth Day of September, 2006

JON W. DUDAS
*Director of the United States Patent and Trademark Office*